United States Patent [19]

Dahm et al.

[11] 4,428,975

[45] Jan. 31, 1984

[54] PROCESS FOR IMPROVING NITRIDE DEPOSITION ON A SEMICONDUCTOR WAFER

[75] Inventors: Jonathan C. Dahm; John G. Franka, both of Austin, Tex.

[73] Assignee: Motorola, Inc., Schaumburg, Ill.

[21] Appl. No.: 461,715

[22] Filed: Jan. 28, 1983

[51] Int. Cl.³ .......................................... H01L 21/318
[52] U.S. Cl. ....................................... 427/94; 427/86; 427/95
[58] Field of Search ............................. 427/94, 86, 95

[56] References Cited

U.S. PATENT DOCUMENTS 4,279,947 7/1981 Goldman .............................. 427/94
4,389,967 6/1983 Shimoda ............................. 118/729

FOREIGN PATENT DOCUMENTS 1,957,952 5/1971 Fed. Rep. of Germany ........ 427/94

OTHER PUBLICATIONS

Bronchard et al., "Method for Eliminating Contamination by $Si_3N_4$ and/or $SiO_2$ Particles in Chemical Deposition Equipment", IBM TDB, vol. 22, No. 5, Oct. 1979, p. 1886.

Primary Examiner—John D. Smith
Attorney, Agent, or Firm—James L. Clingan, Jr.

[57] ABSTRACT

In a process for depositing nitride on semiconductor wafers in a tube, streaks can develop on the wafers. The streaks are eliminated by using a quartz tube which has an inside surface coated with polysilicon for the nitride deposition.

4 Claims, 2 Drawing Figures

PROCESS FOR IMPROVING NITRIDE DEPOSITION ON A SEMICONDUCTOR WAFER

FIELD OF THE INVENTION

This invention relates, in general, to semiconductor processes, and more particularly to processes which include depositing nitride on a semiconductor wafer.

BACKGROUND ART

Typically, at some step in the manufacture of semiconductors, nitride is deposited on semiconductor wafers. A typical process for nitride deposition on semiconductor wafers of silicon includes reacting ammonia ($NH_3$) with diclorosilane ($SiH_2CL_2$, hereinafter referred to as DCS) to obtain silicon nitride ($Si_3N_4$). The reaction is as follows:

$$3SiH_2Cl_2 + 10NH_3 \rightarrow Si_3N_4 + 6NH_4CL + 6H_2$$

The $NH_4CL$ and $H_2$ are just by-products of the reaction. Typically, wafers are inserted inside a tube which has quartz ($SiO_2$) walls for receiving silicon nitride at a low pressure. DCS and ammonia are then introduced and form the silicon nitride which is deposited upon the wafers. When a tube has been used for this purpose, a problem develops wherein the wafers which subsequently receive a nitride deposition have what appear to be streaks across their faces. Observation under a microscope reveals that the streaks are comprised of many spots of excessive nitride growth. Wafers which have such spots of excessive nitride growth are rejected because of the resulting non-uniformity on the surface which can cause problems with subsequent steps in the process. Attempts to solve the problem included varying tube pressure, varying tube temperature, varying DCS to ammonia ratio, introducing stand alone DCS and ammonia flows, and applying HCL. None of these, however, resulted in improvement of any significance.

One technique which did result in substantial improvement is to purge the quartz tube with oxygen between wafer runs. This technique is described in U.S. patent application Ser. No. 378,927, Hogan et al., entitled "Process For Improving Nitride Deposition On A Semiconductor Wafer", filed May 14, 1982, and assigned to the assignee hereof. At least one disadvantage of this technique is that there still remained a relatively high particle defect density.

SUMMARY OF THE INVENTION

An object of the invention is to provide an improved process for the deposition of nitride on semiconductor wafers.

Another object of the invention is to provide an improved process for depositing nitride on semiconductor wafers wherein the wafers are clear of spots of excessive nitride growth.

Yet another object of the invention is to coat a tube used for nitride deposition with polysilicon to prevent spots of excessive nitride growth.

These and other objects of the present invention are accomplished by using a tube which is coated with polysilicon for nitride deposition. Semiconductor wafers are inserted into the polysilicon-coated tube which is heated. Ammonia and Dichlorosilane are introduced into the polysilicon-coated tube to deposit nitride on the wafers.

DESCRIPTION OF A PREFERRED EMBODIMENT

Figures 1, 2:
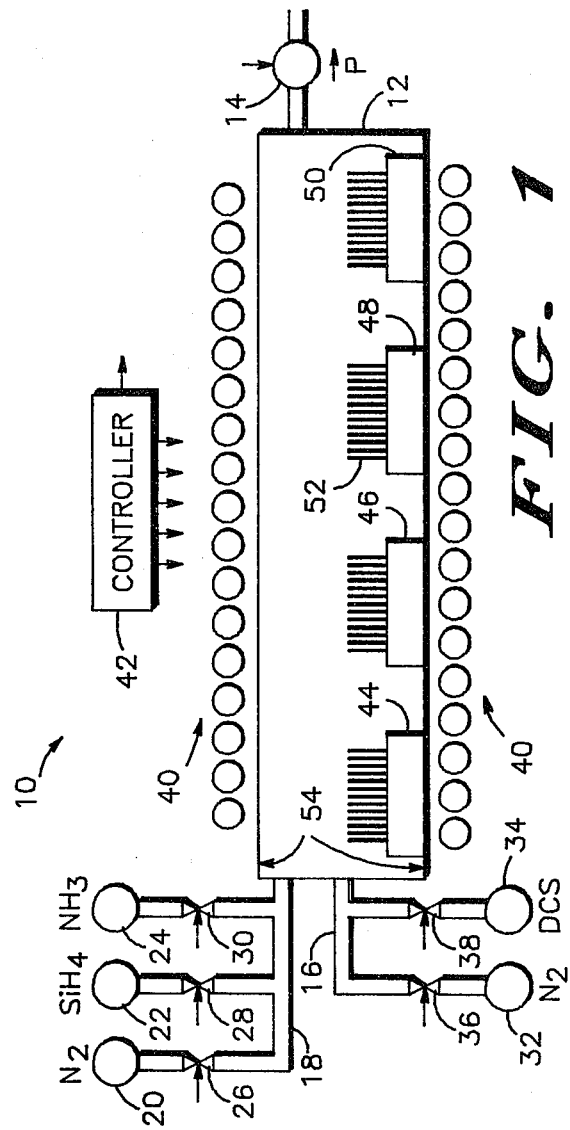
FIG. 1 shows in schematic form an apparatus useful in practicing the invention in one form.
FIG. 2 outlines process steps useful in understanding the present invention.

Shown in FIG. 1 is an apparatus 10 for practicing the preferred embodiment. Apparatus 10 includes a tube 12, having a pump 14 at one end and gas entry pipes 16 and 18 at the other end. Containers 20, 22 and 24 of nitrogen ($N_2$), silane ($SiH_4$) and ammonia ($NH_3$), respectively, are coupled to tube 12 via pipe 18 under the control of flow controllers 26, 28 and 30, respectively. Containers 32 and 34 of nitrogen and dichlorosilane (DCS), respectively, are coupled to tube 12 via pipe 16 under the control of flow controllers 36 and 38, respectively. Pipes 16 and 18 are shown for convenience as one being over the other but in practice are preferably side by side. Heating coils 40 surround tube 12 to heat tube 12 to a desired temperature. A controller 42 provides signals to flow controllers 26, 28, 30, 36 and 38 and pump 14 to control the operation thereof. Tube 12 is of conventional quartz crystal of which Cryco is one manufacturer. Controller 42 is a Tylan Tymer Model 16. Pump 14 is a Leybold Model D27. Heating coils 40 are conventional heating coils of which Thermco is one manufacturer.

Boats 44, 46, 48 and 50 of semiconductor wafers are shown inside tube 12 with boat 44 nearest the gas entry end and boat 50 nearest the pump end. A typical wafer 52 is shown as being in boat 48. The semiconductor material of the wafers for the preferred embodiment is silicon. For convenience, FIG. 1 shows 11 wafers in each boat 44–50, whereas a typical boat in practice preferably holds 50 wafers. Tube 12 has an inside surface 54 which is coated with polysilicon.

The coating of surface 54 with polysilicon is achieved by conventional means prior to the insertion of boats 44–50 into tube 12. Tube 12 is heated to about 625° C. by heating coils 40. Tube 12 is pumped down by pump 14 to a vacuum of in the order of 1 milliTorr. Nitrogen from container 20 is flowed through tube 12 to purge tube 12 at a pressure of about 200 milliTorr for 10 minutes. Tube 12 is then again, pumped down. Silane from container 22 is flowed through tube 12 at a rate of 20 standard cubic centimeters per minute (SCCM) at a pressure of about 800 milliTorr. The silane decomposes to polysilicon (Si) and hydrogen gas ($H_2$) under these conditions. The polysilicon coats inside surface 54 of tube 12. The silane flow is maintained for about 3200 minutes to obtain a thickness of polysilicon of at least 10 microns. The deposition of polysilicon on semiconductor wafers is well-known in the art. That a quartz tube such as tube 12 will also be coated with polysilicon during the course of such a process is also well-known. Previously, when a quartz tube which was so coated with polysilicon was to be used for some other process step, the polysilicon was first removed before using it in such process step. Applicants, however, have discovered that a polysilicon-coated tube can be advantageously used in a nitride deposition process step. Tube 12 is advantageously coated in the absence of semiconductor wafers instead of incidental to a polysilicon deposition step to ensure uniformity of coating.

For nitride deposition, tube 12 is maintained at about 750° C. by heating coils 40. Boats 44–50 are inserted into tube 12 with the wafers facing the pump end. Tube 12 is pumped down by pump 14 to a vacuum of in the order of 1 milliTorr. Nitrogen from container 20 is flowed through tube 12 to purge tube 12 at a pressure of about 200 milliTorr for 10 minutes. Tube 12 is then again pumped down. Ammonia from container 24 is flowed through tube 12 at a rate of 135 SCCM for 3 minutes before introducing DCS from container 34. After the 3 minutes DCS is flowed through tube 12 at a rate of 30 SCCM while ammonia is still flowing at 135 SCCM. Pressure in tube 12 is about 500 milliTorr while both ammonia and DCS are flowing. With both DCS and ammonia flowing, nitride is being deposited on the wafers. Consequently, the time duration chosen for flowing ammonia and DCS together is directly related to the desired nitride thickness on the wafers, i.e., the thicker the desired nitride, the longer the required time duration. Typically, the time duration is determined experimentally prior to a production run. An ammonia to DCS ratio of 4.5 to 1 is maintained even though the nitride reaction implies a 10 to 3 ratio in order to ensure that the DCS fully reacts.

After the desired time duration has elapsed, the DCS flow is stopped while the ammonia flow continues for an additional 3 minutes to ensure there is no DCS residue. Tube 12 is pumped down again to complete the process of clearing tube 12 of ammonia and DCS. Nitrogen from container 20 is flowed into tube 12 for 5 minutes with pump 14 turned off to begin backfilling tube 12. Nitrogen from container 32 is flowed until atmospheric pressure is reached to complete the backfilling process. Nitrogen from container 20 is provided at a relatively low pressure compared to that provided by container 32. The backfilling process begins by introducing nitrogen from container 20 so that the pressure inside tube 12 does not change too rapidly. After tube 12 has been backfilled, boats 44–50 are removed.

After the removal of boats 44–50, another group of boats of semiconductor wafers can be inserted into tube 12 to begin the nitride deposition process again. Polysilicon-coated tube 12 is thus available for continuous use for nitride deposition. In a typical manufacturing facility there are a number of locations which use quartz tubes such as tube 12 for various processing steps. Tube 12 could undergo polysilicon coating at one location, be removed from that location after coating, then used in another location for nitride deposition.

FIG. 2 shows the basic process steps of introducing silane to cause a polysilicon coating to form, inserting a first group of wafers, introducing ammonia and DCS for nitride deposition, removing the first group of wafers, and then inserting a second group of wafers.

Previously, tube 12 would often become contaminated so that wafers such as wafer 52 would have a large number of spots of excessive nitride growth. Visually the spots would collectively appear as streaks of white haze. Wafer 52 could have a streak which covered anywhere from a few percent of wafer 52 to almost the entire wafer 52. Analysis indicated that spots contained only silicon and nitrogen with no sign of contaminants such as chlorine or sodium. Electrical pinhole analysis showed that wafers with streaks had 50 to 150 percent more pinholes than wafers that did not have streaks. There was also a lowering of dielectric strength of streaked wafers. Experience also indicated that reliability problems developed in the course of processing. Additionally there was no practical way to rework streaked wafers. Accordingly scrapping of entire wafers became common place. The problem of streaking was more severe at the pump end. To compensate for this, no boat, such as boat 50, at the pump end was inserted. This reduced throughput. Even so, on occasion as many as 4% of the wafers would have to be scrapped for streaks. A number of experiments were tried. One set of experiments varied process parameters including tube pressure, tube temperature, DCS to ammonia ratio, and introducing a stand alone DCS flow. Only the DCS flow had any effect. It made the problem worse. Another discovery was that merely inserting wafers into a tube which exhibited the problem but using another tube for the nitride deposition which did not exhibit the problem still resulted in streaked wafers. Postulating that DCS was contaminating the tube which would in turn emanate particles onto inserted wafers causing excessive nitride growth on wafers, resulted in trying experiments directed toward gettering DCS from the tube. Trying HCl and ammonia as gettering agents resulted in failure. Introducing oxygen resulted in the tube sparkling. Further experiments showed that a 20 minute flow of oxygen at 2 Torr virtually eliminated streaks. Use of a low DCS flow during initial coating of a tube resulted in the $O_2$ purge eliminating all streaks. A closer look revealed, however, that there was still a relatively large particle defect density. The use of polysilicon-coated tube 12 resulted in a substantially reduced defect density. Additionally, the vacuum line, commonly known as a foreline, took longer to become clogged. Presumably, having a polysilicon-coated inside surface resulted in the formation of fewer contaminants which attached to the foreline. In practice, the oxygen purge step may also be used between wafer groups because it is a relatively inexpensive step which is not very time consuming. Because the oxygen purge has been shown to be useful for purging some contaminants which nitrogen cannot remove, the oxygen purge may be found desirable to retain.

Tubes are commercially available which are pure silicon which could presumably be used in place of a polysilicon-coated quartz tube. This is not a preferred solution because such tubes are an order of magnitude more expensive than quartz tubes.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

We claim:

1. A method for using a tube having an inside surface which is coated with polysilicon, comprising:
   heating said tube;
   placing a semiconductor wafer in said tube; and
   introducing ammonia and dichlorosilane into said tube to deposit nitride on said wafer.

2. The method of claim 1 wherein the tube is a quartz tube.

3. A process for depositing nitride on a semiconductor wafer, comprising:
   heating a quartz tube;
   introducing silane into said tube to coat an inside surface of said tube with polysilicon;
   heating said polysilicon-coated tube;

inserting semiconductor wafers into said polysilicon-coated tube; and introducing ammonia and dichlorosilane into said polysilicon-coated tube to deposit nitride on said wafer.

4. A process for consecutively subjecting groups of semiconductor wafers to nitride deposition, comprising:

heating a quartz tube;

introducing silane into said tube to coat an inside surface of said tube with polysilicon;

heating said polysilicon-coated tube;

inserting a first group of semiconductor wafers into said polysilicon-coated tube;

introducing ammonia and dichlorosilane into said polysilicon-coated tube to deposit nitride on said first group of semiconductor wafers;

removing said first group from said polysilicon-coated tube;

inserting a second group of semiconductor wafers into said polysilicon-coated tube; and introducing ammonia and dichlorosilane into said polysilicon-coated tube to deposit nitride on said second group of semiconductor wafers.

* * * * *